United States Patent
Song et al.

(10) Patent No.: US 9,689,340 B2
(45) Date of Patent: Jun. 27, 2017

(54) CONTROLLER INTEGRATED FUEL PUMP MODULE

(71) Applicants: Hyundai Motor Company, Seoul (KR); Kia Motors Corporation, Seoul (KR)

(72) Inventors: Ju Tae Song, Gunpo-si (KR); Byung Cheol Lee, Hwaseong-si (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 186 days.

(21) Appl. No.: 14/461,111

(22) Filed: Aug. 15, 2014

(65) Prior Publication Data

US 2015/0152805 A1 Jun. 4, 2015

(30) Foreign Application Priority Data

Dec. 2, 2013 (KR) ........................ 10-2013-0148416

(51) Int. Cl.
*F02D 41/30* (2006.01)
*H05K 5/06* (2006.01)
*H05K 5/00* (2006.01)

(52) U.S. Cl.
CPC ....... *F02D 41/3082* (2013.01); *H05K 5/0056* (2013.01); *H05K 5/064* (2013.01); *F02D 2200/0602* (2013.01); *F02D 2400/18* (2013.01)

(58) Field of Classification Search
CPC .. H05K 5/0056; H05K 5/064; F02D 2400/18; F02D 2200/0602

USPC .......................................... 137/560; 123/509
See application file for complete search history.

(56) References Cited

U.S. PATENT DOCUMENTS

| | | | | | |
|---|---|---|---|---|---|
| 5,063,477 | A | * | 11/1991 | Paggen | H05K 7/20572 361/688 |
| 5,454,697 | A | * | 10/1995 | Nakanishi | F02M 37/10 123/509 |
| 5,961,222 | A | * | 10/1999 | Yabe | F16C 19/52 384/476 |
| 7,458,365 | B2 | * | 12/2008 | Hazama | F04B 49/065 123/509 |
| 7,806,109 | B2 | * | 10/2010 | Tateishi | B01D 35/027 123/509 |

(Continued)

FOREIGN PATENT DOCUMENTS

| | | |
|---|---|---|
| JP | 55-58052 U | 4/1980 |
| JP | 08-018184 A | 1/1996 |

(Continued)

*Primary Examiner* — David M Sinclair
*Assistant Examiner* — Robert Brown
(74) *Attorney, Agent, or Firm* — Morgan Lewis & Bockius LLP (57) ABSTRACT

A controller integrated fuel pump module may include a receiving part formed on an outer surface of a flange assembled in a fuel tank, a PCB assembly configured by mounting elements of a controller to a PCB, wherein the PCB assembly is molded by a molding part while being received in the receiving part, and a convexo-concave portion having a shape in which recesses and bosses, the convexo-concave portion being repeatedly formed on an inner surface of the receiving part, such that a bonding force between the receiving part and the molding part is increased by the convexo-concave portion.

8 Claims, 6 Drawing Sheets

(56) References Cited

U.S. PATENT DOCUMENTS

| | | | | |
|---|---|---|---|---|
| 7,827,969 B2* | 11/2010 | Yamamoto | ......... | F02M 37/0082 123/509 |
| 7,954,476 B2* | 6/2011 | Murakoshi | ........... | F02M 37/103 123/509 |
| 8,561,595 B2* | 10/2013 | Baek | .................... | F02M 37/103 123/497 |
| 8,672,651 B2* | 3/2014 | Pae | ......................... | F04B 17/03 123/497 |
| 2004/0247467 A1* | 12/2004 | Ito | ....................... | F02M 37/048 417/423.1 |
| 2005/0100461 A1* | 5/2005 | Izutani | ................ | B01D 35/027 417/423.8 |
| 2007/0215115 A1* | 9/2007 | Hazama | ............... | F02D 33/003 123/458 |
| 2008/0011276 A1* | 1/2008 | Satoh | ................... | F02M 37/106 123/509 |
| 2009/0015293 A1* | 1/2009 | Ito | ..................... | H03K 19/0016 326/81 |
| 2009/0031995 A1* | 2/2009 | Tateishi | .............. | F02M 37/106 123/509 |
| 2009/0090330 A1* | 4/2009 | Tateishi | ............ | F02M 25/0854 123/357 |
| 2012/0000556 A1* | 1/2012 | Baek | .................... | F02M 37/103 137/565.17 |
| 2012/0298897 A1* | 11/2012 | Nakamura | ............ | B60T 8/3675 251/129.15 |
| 2014/0299393 A1* | 10/2014 | Matsuda | .................... | B62J 9/00 180/65.1 |
| 2014/0318646 A1* | 10/2014 | Song | .................... | F02D 41/3082 137/560 |
| 2014/0367183 A1* | 12/2014 | Matsuda | ................ | B62K 11/04 180/220 |

FOREIGN PATENT DOCUMENTS

| | | |
|---|---|---|
| JP | 08-177668 A | 7/1996 |
| JP | 2001-214826 A | 8/2001 |
| JP | 2001-214827 A | 8/2001 |
| JP | 2005-155602 A | 6/2005 |
| JP | 2008-091662 A | 4/2008 |
| JP | 2011-163211 A | 8/2011 |
| JP | 2011-163212 A | 8/2011 |
| JP | 2011-179409 A | 9/2011 |
| JP | 2011-202646 A | 10/2011 |
| KR | 10-2011-0067240 A | 6/2011 |
| KR | 1020120100782 A | 9/2012 |

* cited by examiner

Section A-A

FIG.5

Section B-B

FIG.6

CONTROLLER INTEGRATED FUEL PUMP MODULE

CROSS-REFERENCE TO RELATED APPLICATION

The present application claims priority to Korean Patent Application No. 10-2013-0148416 filed on Dec. 2, 2013, the entire contents of which is incorporated herein for all purposes by this reference.

BACKGROUND

Field of the Invention

The present invention relates to a fuel pump module for a vehicle. More particularly, the present invention relates to a controller integrated fuel pump module by which deformation of a receiving part and a flange can be minimized and introduction of moisture between the receiving part and a molding part can be restrained.

Description of Related Art

As generally known in the art, a fuel pump module for feeding a fuel stored in a fuel tank to an injector of an engine is installed in the fuel tank of a vehicle.

A known fuel pump module includes a fuel pump, a filter for filtering a fuel pumped by the fuel pump to remove foreign substances, a reservoir cup in which the fuel pump and the filter are installed and fixed to a fuel tank, a bracket for fixing the fuel pump to the reservoir cup, and a flange (or holder cup) for fixing the fuel pump and the reservoir cup to the fuel tank.

Then, the fuel pump module is configured by bringing the fuel pump, the reservoir cup, and the filter into a module.

Recently, a variable pressure control fuel pump system has been developed and applied for the purpose of improving a fuel ratio of a vehicle, which system is a system for variably controlling a supply pressure of a fuel in real time in conjunction with an operation state of an engine.

A pressure sensor for detecting a supply pressure of a fuel fed by a fuel pump is installed in the variable pressure control fuel pump system, and a current pressure detected by the pressure sensor and a target pressure determined according to an operation state of the engine are compared and a supply pressure of the fuel is fed back in real time.

Figure 1:
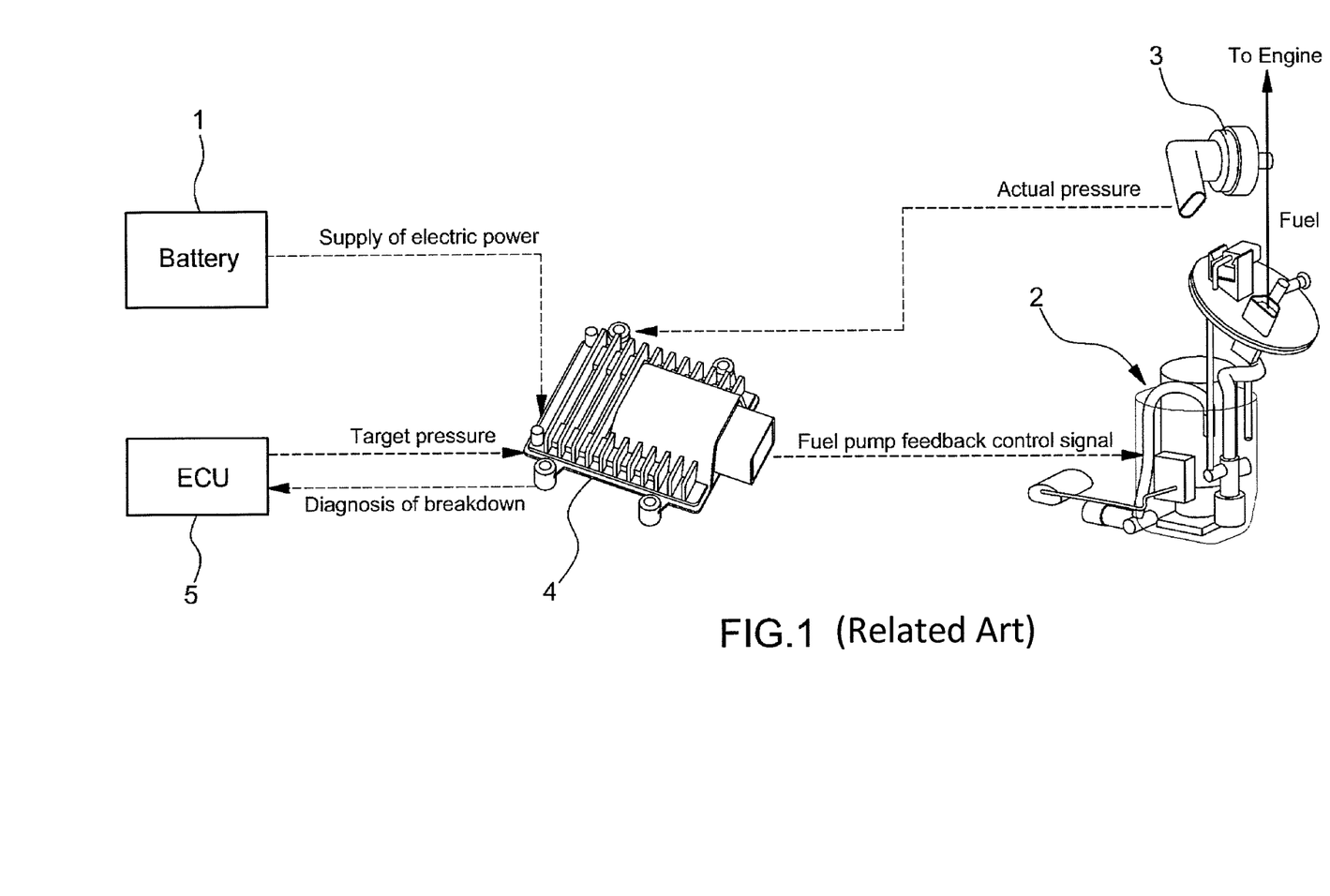
FIG. 1 is a diagram schematically showing a main configuration of a variable pressure control fuel pump system.

FIG. 1 is a diagram schematically showing a main configuration of a variable pressure control fuel pump system, which includes a battery 1 for supplying driving power, a fuel pump module 2 fixedly installed within a fuel tank (not shown), a pressure sensor 3 for detecting a supply pressure of a fuel supplied into an engine, a controller 4 for feedback controlling driving of a fuel pump (pump motor), and an ECU 5 for determining a target pressure according to an operation state of the engine while receiving breakdown diagnosis information from the controller 4 and transmitting the determined target pressure to the controller 4.

The pressure sensor 3 is installed in a fuel supply pipe connected from the fuel pump module 2 to the engine.

Meanwhile, in the conventional variable pressure control fuel pump system, the controller 4 is manufactured as a separate component in which a printed circuit board (PCB) to which various elements are mounted is embedded in a housing and is mounted to the fuel tank, in which case a controller mounting bracket for fixing the controller to the fuel tank is necessary.

In addition, complex electrical wirings and connectors for electrically connecting the controller and the pump motor are necessary, and components such as a clamp for fixing the electrical wirings to a periphery of the fuel tank is necessary.

As the configuration of the variable pressure control fuel becomes complex and the number of components such as an electrical wiring and a connector assembly, a controller housing, and a mounting bracket increases, the manufacturing costs of the system increase, and accordingly, it is difficult to apply the system to a large-sized luxury vehicle, a middle-sized vehicle, and a small-sized vehicle.

Switching noise of a switching element in the controller is radiated through an electrical wiring, and thus electrical noise becomes severe as an electrical wiring between the controller and the pump motor becomes longer.

Further, a performance of the pump motor (DC motor) is proportional to an applied voltage, in which case a voltage drop (0.1 V to 0.2 V) is generated as an electrical wiring between the controller and the pump motor becomes longer, and accordingly, a performance of the motor lowers.

Figure 2:
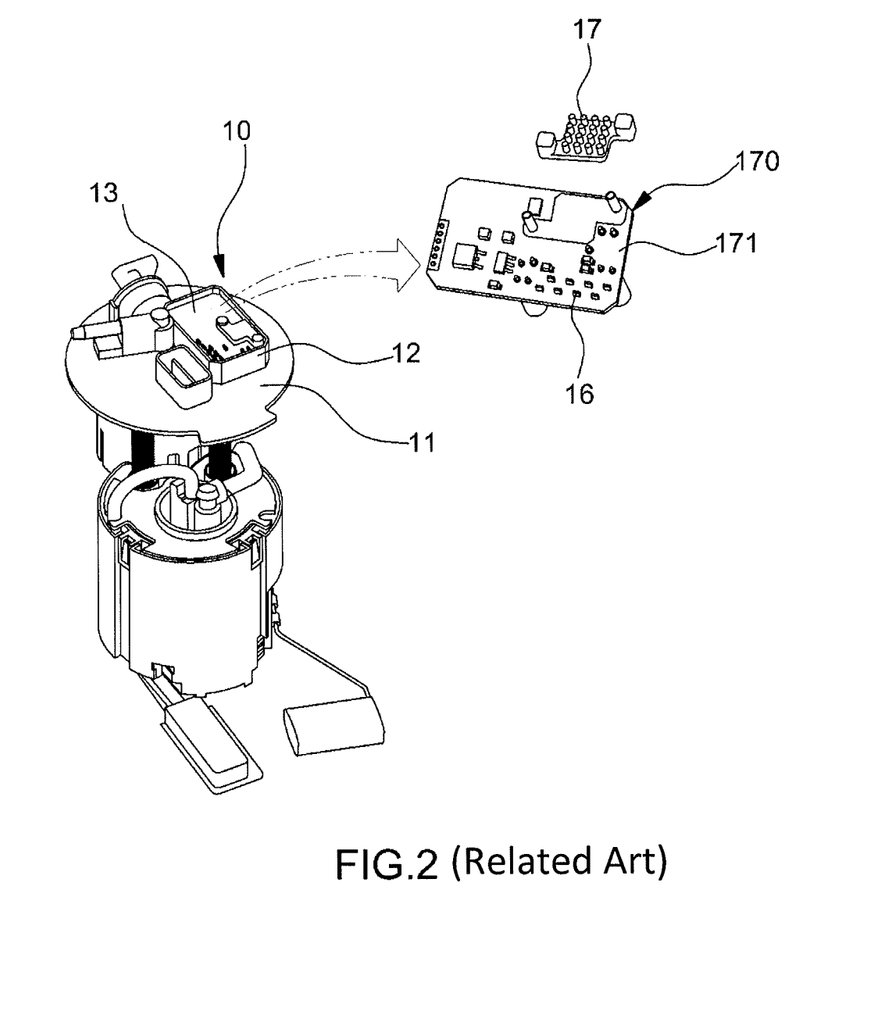
FIG. 2 is a perspective view showing a controller integrated fuel pump module according to the related art.

In order to solve the above problems, as shown in FIG. 2, a controller integrated fuel pump module 10 obtained by receiving a PCB assembly 14 including a printed circuit board (PCB) 15 and various elements 122 in an interior space of a receiving part 12 provided in a flange 11, and molding and fixing the PCB assembly 14 with a molding material has been suggested.

In the controller integrated fuel pump module 10, a terminal (not shown) in which a molding part 130 and a flange 11 are integrally buried serves as an electrical wiring of a conventional controller while the molding part 130 enclosing the PCB assembly 14 serves as a housing of the conventional controller.

Thus, as compared with a conventional technology of providing a controller as a separate component and mounting the controller to a fuel tank, complex and long electrical wirings and connectors of the electrical wirings can be removed and a controller housing, a mounting bracket, and electrical wiring fixing components such as a clamp can be removed, whereby the number of components can be reduced and manufacturing costs can be reduced.

Further, excessive electrical noise and drop of a voltage applied to a motor that occur due to complex and long electrical wirings can be improved.

However, in the controller integrated fuel pump module 10, heat of the switching element (FET) mounted to the circuit board 15 is transferred through a heat dissipating member 125 and a terminal such that a size of the flange 11 (molded resin material) may be deformed and thus a sealed part of the tank may be deformed.

Further, since the flange 11 with which the receiving part 12 is integrally formed has an excellent surface roughness, bonding performance of the receiving part 12 and the molding part 130 is not good, whereby when bonding surfaces of the receiving part and the molding part are separated from each other, a short circuit may occur due to introduction of moisture.

Furthermore, due to expansion and contraction of the molding part, the flange may be deformed, and elements may be deformed and damaged, so that pores may be generated in the interior of the molding part as the air bubbles may not be smoothly discharged when a molding liquid is injected.

The information disclosed in this Background of the Invention section is only for enhancement of understanding of the general background of the invention and should not be taken as an acknowledgement or any form of suggestion that this information forms the prior art already known to a person skilled in the art.

BRIEF SUMMARY

Various aspects of the present invention are directed to providing a controller integrated fuel pump module that can minimize deformation of a receiving part and a flange and restrains introduction of moisture between the receiving part and a molding part and to providing a robust controller integrated structure that can improve strength of a receiving part, can increase a bonding performance between the receiving part and a molding part, can secure a robustness corresponding to introduction of moisture, can restrain generation of a short circuit, can restrain generation of pores in the molding part, and can prevent deformation and damage of a flange even when components such as a capacitor are exploded.

In an aspect of the present invention, in a controller integrated fuel pump module, a receiving part is formed on an outer surface of a flange assembled in a fuel tank, the fuel pump module may have a controller integrated structure in which a PCB assembly configured by mounting elements of a controller to a PCB is molded by a molding part while being received in the receiving part, and a convexo-concave portion having a shape in which recesses and bosses are repeated is formed on an inner surface of the receiving part such that a bonding force between the receiving part and the molding part is increased by the convexo-concave portion.

The convexo-concave portion may have a pattern in which recesses and bosses are repeated along a periphery of an inner surface of the receiving part, and the recesses and the bosses are formed lengthily on the inner surface of the receiving part.

Upper ends of the recesses and the bosses are located above the inner surface of the receiving part.

The upper ends of the recesses and the bosses are formed above a location of the PCB or at a height of the PCB.

A side wall of the receiving part forms a dual wall structure including an outer wall and a partition wall separated inwards from the outer wall and the convexo-concave portion is formed on an inner surface of the partition wall.

The partition wall is formed below the outer wall and the molding part, and a molding liquid is injected into both an interior space of the partition wall in which the PCB assembly is located and a space of the outer wall and the partition wall to form the molding part.

At least a portion of a lower surface of the receiving part and an upper surface of the flange are connected by a connecting part while being spaced apart from each other, and the receiving part may have an empty space between the receiving part and an upper surface of the flange.

A drainage hole for discharging moisture existing between bonding surfaces of the receiving part and the molding part is formed on a side surface of the receiving part.

In another aspect of the present invention, a controller integrated fuel pump module may include a receiving part formed on an outer surface of a flange assembled in a fuel tank, a PCB assembly configured by mounting elements of a controller to a PCB, wherein the PCB assembly is molded by a molding part while being received in the receiving part, a convexo-concave portion having a shape in which recesses and bosses, the convexo-concave portion being repeatedly formed on an inner surface of the receiving part, such that a bonding force between the receiving part and the molding part is increased by the convexo-concave portion.

Accordingly, the controller integrated fuel pump module can minimize deformation of the receiving part and the flange, and can restrain introduction of moisture between the receiving part and the molding part.

Further, the controller integrated fuel pump module can improve strength of a receiving part, can increase a bonding performance between the receiving part and a molding part, can secure a robustness corresponding to introduction of moisture, can restrain generation of a short circuit, can restrain generation of pores in the molding part, and can prevent deformation and damage of a flange even when components such as a capacitor are exploded.

The methods and apparatuses of the present invention have other features and advantages which will be apparent from or are set forth in more detail in the accompanying drawings, which are incorporated herein, and the following Detailed Description, which together serve to explain certain principles of the present invention.

It should be understood that the appended drawings are not necessarily to scale, presenting a somewhat simplified representation of various preferred features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

Reference will now be made in detail to various embodiments of the present invention(s), examples of which are illustrated in the accompanying drawings and described below. While the invention(s) will be described in conjunction with exemplary embodiments, it will be understood that the present description is not intended to limit the invention(s) to those exemplary embodiments. On the contrary, the invention(s) is/are intended to cover not only the exemplary embodiments, but also various alternatives, modifications, equivalents and other embodiments, which may be included within the spirit and scope of the invention as defined by the appended claims.

Hereinafter, exemplary embodiments of the present invention will be described in detail with reference to the accompanying drawings so that those skilled in the art to which the present invention pertains can easily carry out the invention.

The present invention relates to a controller integrated fuel pump in which constituent elements of a controller is received and molded in a receiving part of a flange, and improves a shape of the receiving part and a mounting structure of a PCB assembly as compared with a conventional technology.

Figure 3:
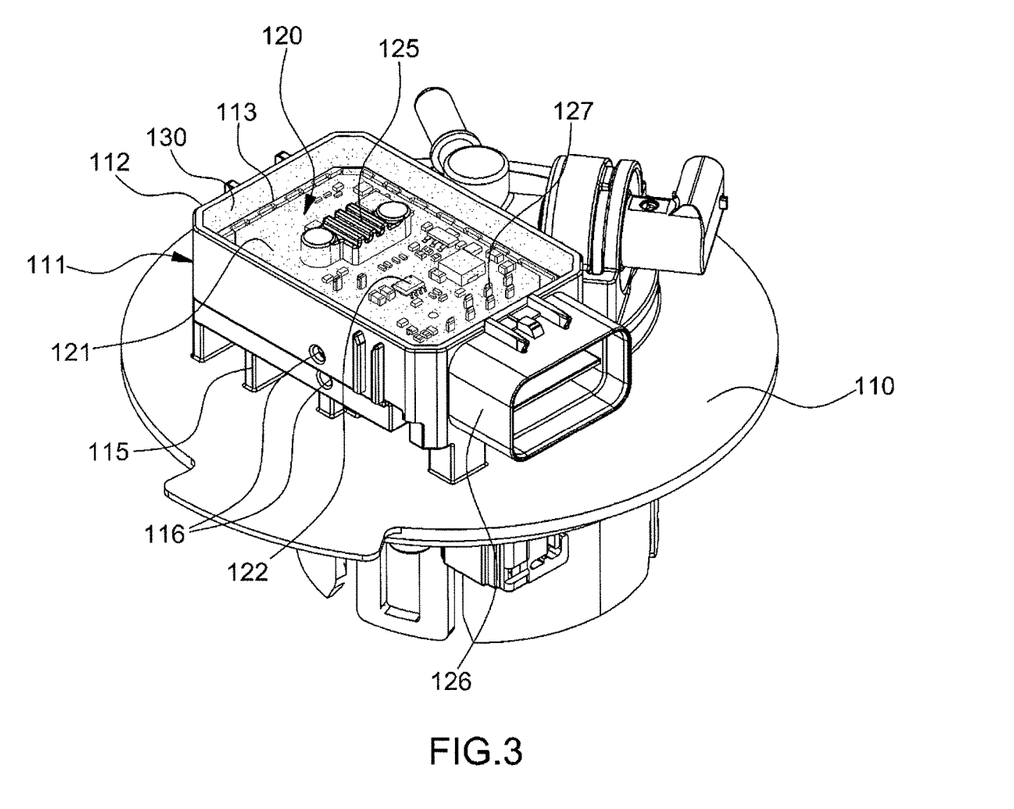
FIG. 3 is a perspective view showing a flange part of a controller integrated fuel pump module according to an exemplary embodiment of the present invention.

FIG. 3 is a perspective view showing a flange part of a controller integrated fuel pump module according to an exemplary embodiment of the present invention, and shows a receiving part 111 formed in a flange 110, and a PCB assembly 120 received and molded in the receiving part 111.

If the PCB assembly 120 is received and molded in the receiving part 111 of the flange 110 in the fuel pump module according to the exemplary embodiment of the present invention, only a portion of a heat dissipating member 125 for dissipating heat is exposed to the outside, and since the PCB assembly 120 including a circuit board (PCB) 121 and elements 122 are sealed by a molding part 130, the PCB assembly 120 and the elements 122 except for a portion of the heat dissipating member 125 are hidden so as not to be viewed when the molding part 130 is not formed of a transparent material.

However, FIG. 3 shows an inner shape of the receiving part and the PCB assembly to explain an inner shape of the receiving part 111 and a mounting state of the PCB assembly received in the receiving part 111.

Figure 4:
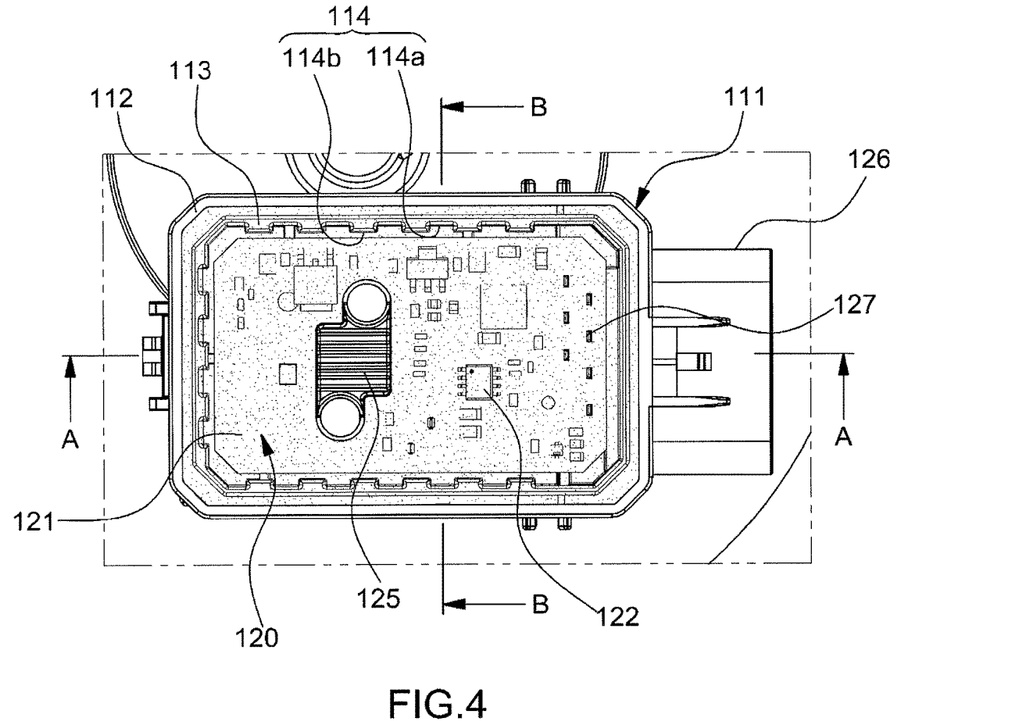
FIG. 4 is a plan view showing a receiving part of a flange and a PCB assembly according to the exemplary embodiment of the present invention.
Figure 5:
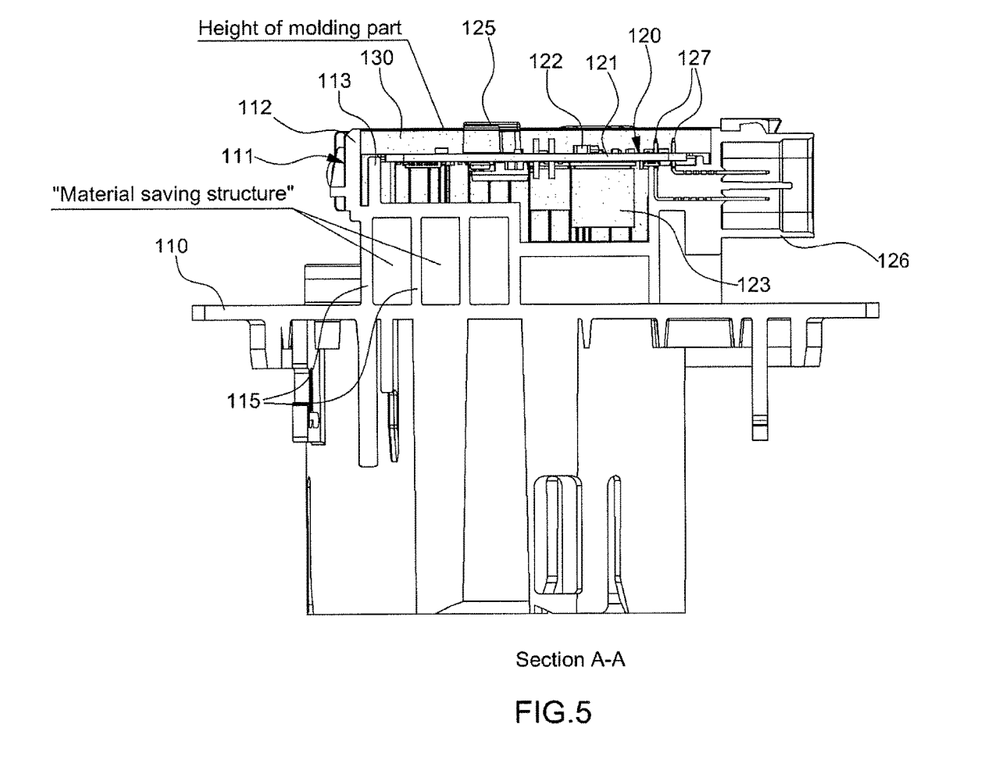
FIG. 5 is a sectional view taken along line A-A of FIG. 4.
Figure 6:
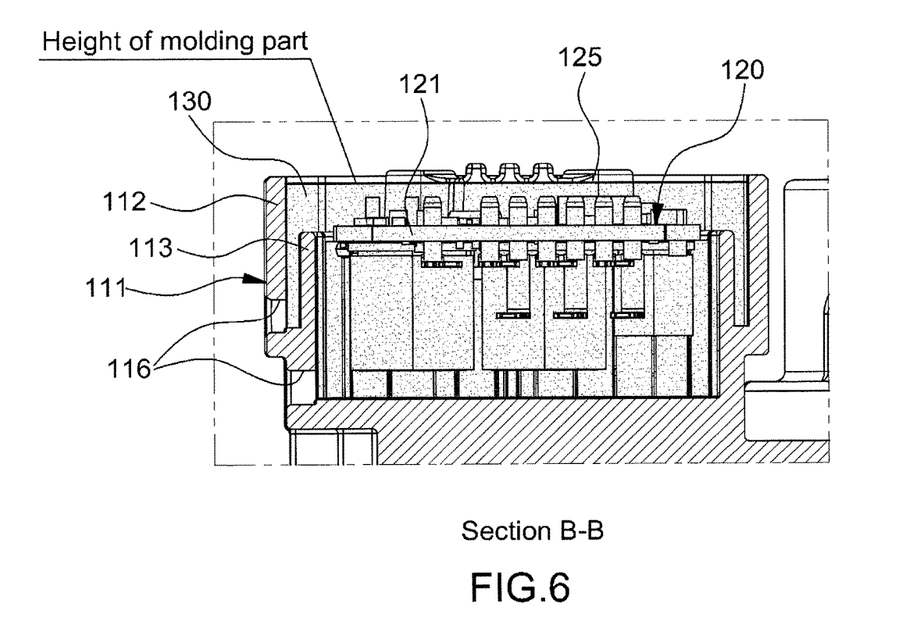
FIG. 6 is a sectional view taken along line B-B of FIG. 3.

FIG. 4 is a plan view showing a receiving part of a flange and a PCB assembly according to the exemplary embodiment of the present invention. FIG. 5 is a sectional view taken along line A-A of FIG. 4. FIG. 6 is a sectional view taken along line B-B of FIG. 3.

First, in the fuel pump module according to an exemplary embodiment of the present invention, a controller integrated structure in which the controller is integrally mounted to the flange is configured by molding and sealing the PCB (circuit board) 121 of the controller to which the elements 122 are mounted while the PCB 121 being received in the receiving part 111 formed on an outer surface of the flange 110.

Here, with the configuration in which the elements 122 are mounted to the PCB 121, the PCB assembly 120 molded in the flange 110 to be fixed performs a function of the controller in the variable pressure control fuel pump system.

The elements 122 mounted to the PCB 121 may include elements of a conventional controller for controlling driving of the fuel pump, including switching elements (an FET and the like) and a capacitor 123.

In the fuel pump module according to the exemplary embodiment of the present invention, the flange 110 is a molded resin material manufactured by injection molding a resin, and has a housing shaped receiving part 111 in which the PCB assembly 120 may be received.

The PCB assembly 120 is molded and sealed without being exposed to the outside while being received in the receiving part 111 of the flange 110 except for a portion of the heat dissipating member 125, in which case since the molding material (hereinafter, referred to as a molding part) 130 seals a periphery of the PCB assembly 120, the PCB assembly 120 may be stably fixed in the receiving part 111.

As shown in FIG. 5, since a lower side of the PCB assembly 120 mounted to the receiving part 111 of the flange 110 as well as an upper side of the PCB assembly 120 should be molded of a molding material, the molding part 130 seals both the upper and lower sides of the PCB assembly 120 after forming a molding liquid injection hole (a hole vertically passing through the PCB) in the PCB 121 and injecting a molding liquid (a liquid molding material) to a lower side of the PCB 121 through the molding liquid injection hole.

The molding part 130 formed in this way completely isolates the PCB assembly 120 from external environments such as temperature and moisture while electrically insulating the PCB assembly 120 from the outside to prevent moisture and foreign substances from being introduced and to insulate the PCB assembly 120 from vibrations of the vehicle as well.

The molding material may be a resin known as a molding material for electronic products or an electrically insulating material, but is not specifically limited. The molding material is preferably a heat resistant material that can be easily bonded to a material of the flange but does not generate cracks due to heat, and is a material that shows a small change of volume when a fuel is deposited.

Meanwhile, in the fuel pump module according to the exemplary embodiment of the present invention, as shown in FIG. 4, a convexo-concave portion 114 is additionally formed in the receiving part 111.

Then, the convexo-concave portion 114 has a pattern shape in which recesses 114a and bosses 114b are repeated along an inner circumference of the receiving part 111, and the recesses 114a and the bosses 114b are formed lengthily upwards and downwards on the inner surface of the receiving part 111.

If the convexo-concave portion 114 having the recesses 114a and the bosses 114b is formed on the inner surface of the receiving part 111 of the flange 110, a contact area between the receiving part 111 and the molding part 130 may increase, and thus a bonding force between the receiving part 111 and the molding part 130 may increase.

Thus, moisture can be prevented from being introduced between the bonding surfaces of the receiving part 111 and the molding part 130, and a short circuit due to introduction of moisture can be solved.

Further, since the recesses 114a and the bosses 114b formed lengthily upwards and downwards on the inner surface of the receiving part 111 performs a reinforcing function of increasing an entire strength of the receiving part, deformation of the receiving part 111 and the flange 110 due to radiation of heat or expansion and contraction of the molding part 130 can be minimized.

Furthermore, even when the capacitor 123 mounted to the PCB 121 is exploded due to application of an overvoltage, cracks of the receiving part 111 and the flange 110 can be prevented, and leakage of a fuel due to cracks of the flange 110 can be solved.

In addition, if upper ends of the recesses 114a and the bosses 114b are located above the inner surface of the receiving part 111, and preferably, above the PCB 21, the recesses 114 can function as an air extraction passage when a molding liquid is injected.

Conventionally, since a gap between a periphery of a PCB and an inner surface of a receiving part is so narrow that air cannot be smoothly discharged (a defect in extraction of air) when a molding liquid is injected and pores may exist in the molding part.

The pores may lower strength of the molding part, and in particular, when the pores are expanded, elements and a soldering part may be damaged (a malfunction of a part may be caused).

Meanwhile, according to the structure in which the recesses 114a and the bosses 114b are formed lengthily upwards and downwards on the inner surface of the receiving part 111, since the recesses 114a form air extraction passages when a molding liquid is injected, generation of pores in the molding part 130 can be restrained.

Next, a connector 126 for external connection is formed in the flange 110, and terminals 127 are installed within the connector 126. The terminals 127 are buried in the molding part 130 to be fixed.

The heat dissipating member 125 for dissipating heat from the PCB assembly 120 to the outside is installed to contact the PCB 121, and one side of the heat dissipating member 125 is exposed to the outside while another side of the heat dissipating member 125 contacts the PCB 121 such that heat may be dissipated into the air through the exposed portion.

Meanwhile, reference numeral 113 of FIG. 5 denotes a partition wall formed within the receiving part 111 of the flange 110, and the partition wall 113 is formed along an inner side of an outer wall 112 of the receiving part 111 while being separated from the outer wall 112.

That is, the side wall of the receiving part 111 forms a dual wall structure including the outer wall 112 and the partition wall 113 separated inwards from the outer wall 112, and the partition wall 113 is formed along an entire periphery of the inside of the outer wall 112.

As shown in FIG. 5, the partition wall 113 has a predetermined height and is lower than heights of the outer wall 112 and the molding part 130. Since a molding liquid is injected into the receiving part 111 such that the entire PCB assembly 120 except for a portion of the heat dissipating member 125 is sealed by the molding part 130, the molding liquid is injected into a space between the outer wall 112 and the partition wall 113 as well as an interior space of the partition wall 113 to form the molding part.

In the dual wall structure of the outer wall 112 and the partition wall 113, the convexo-concave portion 114 forms an inner surface of the partition wall 113.

Even if a fine gap is generated due to deformation of surfaces of the receiving part 111 and the molding part 130 that are bonded to each other after the molding liquid is injected and the molding part 130 is formed, in particular, bonding surfaces of the outer wall 112 and the molding part 130, the partition wall 113 serves to stay moisture introduced between the bonding surfaces.

That is, even if moisture is introduced between the fine gaps of the bonding surfaces, the partition wall 113 prevents moisture from moving toward an inside where the PCB assembly 120 is located, whereby a danger of generating a short circuit in the circuit can be minimized.

As shown in FIG. 5, a material saving structure for separating at least a portion of a lower surface of the receiving part 111 from an upper surface of the flange 110 is applied to the flange 110 according to an exemplary embodiment of the present invention.

When the flange 110 having the receiving part 111 is injection-molded in a mold, the exemplified material saving structure is formed by using a slide core. When the material saving structure is applied, a lower surface of the receiving part 111 and an upper surface of the flange 110 are connected only by connecting parts 115 while being spaced apart from each other such that an empty space is formed between the connecting parts 115.

If the receiving part 111 to which the PCB assembly 120 is mounted and the remaining flange part 110 that is a fuel tank sealing part are spatially separated from each other to have an empty space therebetween while being integrally formed with each other, the remaining flange part 110 that is the fuel tank sealing part is not influenced and leakage of a fuel and a dangerous situation due to the leakage do not occur even if the receiving part 111 is thermally deformed or the capacitor 123 is exploded.

A drainage hole 116 is formed on a side surface of the receiving part 111, in which case the bonding surfaces of the receiving part 111 and the molding part 130 are separated such that moisture can be discharged to the outside through the drainage hole 116 even if moisture is introduced.

When the drainage hole 116 is applied to the receiving part 111, a cap is inserted into the drainage hole 116 in advance to be masked and the is removed if the molding is completed in order to prevent the molding liquid injected into the receiving part 111 from being leaked through the drainage hole 116 or the drainage hole 116 from being blocked.

For convenience in explanation and accurate definition in the appended claims, the terms "upper", "lower", "inner" and "outer" are used to describe features of the exemplary embodiments with reference to the positions of such features as displayed in the figures.

The foregoing descriptions of specific exemplary embodiments of the present invention have been presented for purposes of illustration and description. They are not intended to be exhaustive or to limit the invention to the precise forms disclosed, and obviously many modifications and variations are possible in light of the above teachings. The exemplary embodiments were chosen and described in order to explain certain principles of the invention and their practical application, to thereby enable others skilled in the art to make and utilize various exemplary embodiments of the present invention, as well as various alternatives and modifications thereof. It is intended that the scope of the invention be defined by the Claims appended hereto and their equivalents.

What is claimed is:

1. A controller integrated fuel pump module, wherein a receiving part is formed on an upper surface of a flange assembled in a fuel tank, the fuel pump module has a controller integrated structure in which a PCB assembly configured by mounting elements of a controller to a PCB is molded by a molding part while being received in the receiving part, wherein at least a portion of a lower surface of the receiving part and an upper surface of the flange are connected by a connecting part while being spaced apart from each other, and the receiving part has an empty space between the lower surface of the receiving part and the upper surface of the flange, wherein the fuel pump module has a convexo-concave portion having a shape in which recesses and bosses are repeated is formed on an inner circumferential surface of the receiving part, wherein the recesses and bosses of the convexo-concave portion are repeated along a periphery of the inner circumferential surface of the receiving part and each of the recesses and the bosses is formed to extend upwards and downwards along an axial direction of the receiving part, on the inner circumferential surface of the receiving part, and wherein upper ends of the recesses and the bosses are formed above a location of the PCB or at a height of the PCB.

2. The fuel pump module of claim 1, wherein a side wall of the receiving part includes an outer wall and a partition wall separated inwards from the outer wall and the convexo-concave portion is formed on an inner surface of the partition wall.

3. The fuel pump module of claim 2, wherein the partition wall is formed below the outer wall and the molding part, and a molding liquid is injected into both an interior space of the partition wall in which the PCB assembly is located and a space of the outer wall and the partition wall to form the molding part.

4. The fuel pump module of claim 1, wherein a drainage hole for discharging moisture existing between bonding surfaces of the receiving part and the molding part is formed on a side surface of the receiving part.

5. A controller integrated fuel pump module, comprising:
a receiving part formed on an upper surface of a flange assembled in a fuel tank; and
a PCB assembly configured by mounting elements of a controller to a PCB, wherein the PCB assembly is molded by a molding part while being received in the receiving part, and
a convexo-concave portion having recesses and bosses being repeatedly formed on an inner circumferential surface of the receiving part,
wherein at least a portion of a lower surface of the receiving part and an upper surface of the flange are connected by a connecting part while being spaced apart from each other, and the receiving part has an empty space between the lower surface of the receiving part and the upper surface of the flange,
wherein the recesses and bosses of the convexo-concave portion are repeated along a periphery of the inner circumferential surface of the receiving part and each of the recesses and the bosses is formed to extend upwards and downwards along an axial direction of the receiving part, on the inner circumferential surface of the receiving part, and
wherein upper ends of the recesses and the bosses are formed above a location of the PCB or at a height of the PCB.

6. The fuel pump module of claim 1, wherein a side wall of the receiving part includes an outer wall and a partition wall separated inwards from the outer wall and the convexo-concave portion is formed on an inner surface of the partition wall.

7. The fuel pump module of claim 6, wherein the partition wall is formed below the outer wall and the molding part, and a molding liquid is injected into both an interior space of the partition wall in which the PCB assembly is located and a space of the outer wall and the partition wall to form the molding part.

8. The fuel pump module of claim 5, wherein a drainage hole for discharging moisture existing between bonding surfaces of the receiving part and the molding part is formed on a side surface of the receiving part.

* * * * *